(12) United States Patent
Horiuchi et al.

(10) Patent No.: US 7,076,871 B2
(45) Date of Patent: Jul. 18, 2006

(54) METHOD OF MANUFACTURING A CARBON NANOTUBE DEVICE

(75) Inventors: Kazunaga Horiuchi, Nakai-machi (JP); Masaaki Shimizu, Nakai-machi (JP); Nobuyuki Aoki, Shimizu (JP); Yuichi Ochiai, Abiko (JP)

(73) Assignee: Fuji Xerox Co., Ltd., Tokyo (JP)

( * ) Notice: Subject to any disclaimer, the term of this patent is extended or adjusted under 35 U.S.C. 154(b) by 426 days.

(21) Appl. No.: 10/351,544

(22) Filed: Jan. 27, 2003

(65) Prior Publication Data

US 2006/0123628 A1 Jun. 15, 2006

(30) Foreign Application Priority Data

Feb. 5, 2002 (JP) .............................. 2002-028637

(51) Int. Cl.
*H01R 43/00* (2006.01)
(52) U.S. Cl. .................. 29/857; 29/602.1; 29/620; 29/825; 29/61 R; 204/192.38; 250/306; 264/235; 264/335; 264/346; 436/164; 977/DIG. 1; 977/869; 977/873
(58) Field of Classification Search ................. 29/857, 29/602.1, 620, 825, 61 R; 204/192.38; 250/306; 264/235, 335, 346; 436/164; 977/DIG. 1, 977/869, 873
See application file for complete search history.

(56) References Cited

U.S. PATENT DOCUMENTS 6,239,547 B1 * 5/2001 Uemura et al. ............. 313/495

6,277,318 B1 * 8/2001 Bower et al. ............... 264/346
6,528,785 B1 * 3/2003 Nakayama et al. ......... 250/306
6,579,428 B1 * 6/2003 Takigawa et al. ....... 204/192.38

OTHER PUBLICATIONS

Sumio Iijima, Helical microtubules of graphitic carbon, NATURE, vol. 354, 1991, pp. 56-58.
A. Bachtold et al., Contacting carbon nanotubes selectively with low-ohmic contacts for four-probe electric measurements, Applied Physics Letters, vol. 73 No. 2, 1998, pp. 274-276.
Hyongsoko T. Soh et al., Integrated nanotube circuits: Controlled growth and ohmic contacting of single-walled carbon nanotubes, Applied Physics Letters, vol. 75 No. 5, 1999, pp. 627-629.

(Continued)

*Primary Examiner*—A. Dexter Tugbang
*Assistant Examiner*—Tim Phan
(74) *Attorney, Agent, or Firm*—Oliff & Berridge, PLC

(57) ABSTRACT

A method of manufacturing a carbon nanotube device including an inner electrode, having connecting step, connecting a carbon nanotube to the inner electrode, wherein the connecting step comprises: attaching a conductor to an end or periphery thereof of a needle-shaped or rod-shaped carrying electrode; arranging the carbon nanotube in contact or close to a predetermined connection part of the inner electrode; approaching the end of the carrying electrode on which the conductor is carried to the connection part; and transferring the conductor carried on the carrying electrode to the connection part or periphery thereof to connect the carbon nanotube to the inner electrode.

12 Claims, 12 Drawing Sheets

OTHER PUBLICATIONS

Antonis N. Andriotis et al., Various bonding configurations of transition-metal atoms on carbon nanotubes: Their effect on contact resistance, Applied Physics Letters, vol. 76 No. 26, 2000, pp. 3890-3892.

Y. Zhang et al., Heterostructures of Single-Walled Carbon Nanotubes and Carbide Nanorods, SCIENCE, vol. 285, 1999, pp. 1719-1722.

Y. Zhang et al., Controllable method of fabricating single-wall carbon nanotube tips, Applied Physics Letters, vol. 77 No. 7, 2000, pp. 966-968.

Jeong-O Lee et al., Formation of low-resistance ohmic contacts between carbon nanotube and metal electrodes by a rapid thermal annealing method, Journal of Physics D, vol. 33, 2000, pp. 1953-1956.

R. Martel et al., Ambipolar Electrical Transport in Semiconducting Single-Wall Carbon Nanotubes, Physical Review Letters, vol. 87 No. 25, 2001, pp. 256805-1-256805-4.

* cited by examiner

Diagram of Device

METHOD OF MANUFACTURING A CARBON NANOTUBE DEVICE

CROSS-REFERENCE TO RELATED APPLICATIONS

This application claims priority from Japanese Patent Application No. 2002-28637 filed Feb. 5, 2002.

BACKGROUND OF THE INVENTION

1. Field of the Invention

The present invention relates to a carbon nanotube device which contains at least a carbon nanotube, and to a method of manufacturing such a carbon nanotube device. More particularly, the present invention relates to a method of manufacturing a carbon nanotube device including connecting internal electrodes in the device to a carbon nanotube, and to a carbon nanotube device manufactured using such a method.

2. Description of the Related Art

Fibrous carbons are generally called carbon fibers, and conventionally, several kinds of methods of manufacturing carbon fibers having a thickness of several μm or more in diameter used for structural materials have been studied. At present, of those, the method of manufacturing carbon fibers from polyacrylonitrile (PAN)—or pitch-based materials is the most widely used.

Apart from this, the carbon nanotubes discovered recently are made of a tubular material with a thickness of 1 μm or less in diameter. Ideally, a carbon face of a hexagon mesh forms a tube in parallel to an axis of the tube and plurality of the tube may be multi-layered. It is theoretically estimated that the carbon nanotubes have either a metallic or semiconductor property depending on how carbon hexagon meshes are linked and the thickness of the tubes, allowing expectation that it will be a promising functional material.

Usually, to synthesize the carbon nanotubes, an arc discharge method is used and in addition, the methods including a laser evaporation method, a pyrolytic method, and a method using chemical vapor deposition have recently been studied. The carbon nanotubes recently developed are generally described below.

(Carbon Nanotube)

The material with a diameter of 1 μm or smaller which is finer than carbon fibers, is generally called carbon nanotubes and distinguished from the carbon fibers, although there is no particularly definite boundary therebetween the both types of carbon fibers. By a narrow definition, the material, of which carbon faces with hexagon meshes are almost parallel to the axis of the tube, is called a carbon nanotube and even a variant of the carbon nanotube, around which amorphous carbon exists, is included in the carbon nanotube. (Note that with respect to the present invention, this narrow definition is applied to the carbon nanotube.)

Usually, the narrowly-defined carbon nanotubes are further classified into two types: carbon nanotubes having a structure with a single hexagon mesh tube are called single wall nanotubes (hereafter, simply referred to as "SWNT" in some cases; and the carbon nanotubes made of multilayer hexagon mesh tubes are called multi-wall nanotubes (hereafter, simply referred to as "MWNT" in some cases). Type of carbon nanotubes may be determined depending on how to synthesize and the established conditions to some degree but production of purely one type of the carbon nanotubes has not yet been achieved.

The carbon fibers have larger diameters and incomplete cylindrical mesh structures parallel to the axes of the tubes. The nanotubes produced by a vapor-phase pyrolysis method using a catalyst have a tubular mesh structure parallel to the axis of the tube in the vicinity of a center of the tube and in many cases, a large amount of carbon having a disordered structure surrounds it.

Now, the arc discharge method as a typical method of manufacturing carbon nanotubes, will be briefly described below.

The arc discharge method, which was first discovered by Iijima, is described in detail in "Nature" (Vol. 354, 1991, p 56 to 58). The arc discharge method is a simple method, by which direct current arc discharge is performed using carbon electrode rods in an atmosphere containing argon under about 13300 Pa (100 Torr). The carbon nanotubes grow together with carbon particles of 5 to 20 nm in size in a partial area on a surface of a negative electrode. The resultant carbon nanotubes have a layer structure, in which tubular carbon meshes with a diameter of 4 to 30 nm and a length of about 1 to 50 μm are overlapped, the mesh structure of carbon being helically formed in parallel with its axis.

Helical pitches vary depending on tubes or layers in the tube and for multilayer tubes, the distance between the layers is 0.34 nm, which is almost identical to the distance between graphite layers.

Note that, carbon nanotubes have high electrical conductivity and when an attempt is made to apply the carbon nanotubes to electronic devices (hereafter, in some cases, simply referred to as "devices"), they must be connected to electrodes.

When carbon nanotubes are arranged between a pair of electrodes and the electric resistance across the resultant structure is measured, in many cases, resistance is measured higher than that expected from a high electrical conductivity of a carbon nanotube itself. This is considered to be due to a contact resistance etc. generated between the carbon nanotube and the metallic electrodes. For industrial application of carbon nanotubes, it is extremely important to realize ohmic contacts between the carbon nanotubes and the electrodes, with the contact resistance being reduced.

Gold (gold pad) is widely used as an electrode material for carbon nanotubes. This gives an ohmic contact or no ohmic contact according to the cases; it gives poor reproducibility.

Examples of the method of realizing an ohmic contact between the carbon nanotubes and the metallic electrodes include the following.

(1) A method in which hydrocarbon is graphitized and the resultant is placed between the electrodes and the carbon nanotubes.

(2) A method in which carbon nanotubes are arranged on a gold pad and the joined part is irradiated with electron beams (cf., Applied Physics Letters, 1998, Vol. 73, 274).

(3) A method in which Au/Ti is used as an electrode material (cf., Applied Physics Letters, 1999, Vol. 75, 627).

(4) A method in which a transition metal which readily gives an ohmic contact, such as Sc, Ti, or V, is used as an electrode material (cf., Applied Physics Letters, 2000, Vol. 76, 3890).

(5) A method in which the joined part between the electrode part and the carbon nanotubes are positively chemically combined by heating:

a) It has been confirmed that when Si or a transition metal (Ti or the like) and a carbon nanotube is joined and heated, the Si or transition metal reacts with the carbon of the carbon nanotube to generate as a compound therebetween, a carbide (silicon carbide, or metal carbide). On this occasion, the carbon nanotube and the carbide are joined smoothly in the atomic level to give a better electrical connection therebetween (cf., Science, 1999, Vol. 285, 1719).

b) It has been confirmed that when niobium (Nb) and a carbon nanotube are joined and heated to 950° C., the joined part is converted into niobium carbide as a compound therebetween (cf., Applied Physics letters, 2000, Vol. 77, 966).

c) It has been confirmed that through heat treatment at 800° C. performed on a device including a Ti/Au electrode with which a carbon nanotube is joined so as to convert the joined part into titanium carbide, in some cases, an ohmic contact between the both is achieved (cf., Journal of Physics D, 2000, vol. 33, 1953). In addition, in Physical Review Letters, 2001 vol. 87 256805, it was reported that analysis by X-ray diffraction revealed formation of stable TiC at 800° C. or higher.

As described above, various methods have been considered to realize ohmic contact between the carbon nanotube and the electrodes. However, none of them were easy to realize a complete ohmic contact, with the reproducibility of ohmic contact being insufficient. In the method of positively chemically combining the joined part between the electrode part and the carbon nanotubes by heating, heating cannot be performed at so high a temperature because the carbon nanotubes themselves should be destroyed due to the heat; also realization of complete ohmic contact is difficult to achieve and the reproducibility of ohmic contact has been insufficient.

SUMMARY OF THE INVENTION

Therefore, the present invention is to provide a method of manufacturing a carbon nanotube device including connecting a carbon nanotube to electrodes which can connect them by ohmic contact well and with high reproducibility and also it provides a carbon nanotube device with ohmic contact.

In particular, in order to achieve this, the present invention provides the following.

According to an aspect of the present invention, a method of manufacturing a carbon nanotube device including an inner electrode, having connecting step, connecting a carbon nanotube to the inner electrode, wherein the connecting step comprises:

attaching a conductor to an end or periphery thereof of a needle-shaped or rod-shaped carrying electrode;

arranging the carbon nanotube in contact with or close to a predetermined connection part of the inner electrode;

approaching the end of the carrying electrode on which the conductor is carried to the connection part; and transferring the conductor carried on the carrying electrode to the connection part or periphery thereof to connect the carbon nanotube to the inner electrode.

According to another aspect of the present invention, in the method of manufacturing a carbon nanotube device, the transferring step includes applying a voltage between the carrying electrode and the inner electrode to generate an electric force in an electric field therebetween by which the conductor carried on the carrying electrode is transferred to the connection part.

According to another aspect of the present invention, in the method of manufacturing a carbon nanotube device, the voltage applied between the carrying electrode and the inner electrode in the transferring is a pulse voltage.

According to another aspect of the present invention, in the method of manufacturing a carbon nanotube device, the transferring step includes applying a voltage between the carrying electrode and the inner electrode to generate an electric force in an electric field therebetween by which the conductor carried on to the carrying electrode is transferred to the connection part, in which in the transferring step, the voltage applied between the carrying electrode and the inner electrode is a pulse voltage, and in which electric field intensity caused by the voltage is lower than a threshold of evaporation electric field intensity of the carbon nanotube.

According to another aspect of the present invention, in the method of manufacturing a carbon nanotube device, the carrying electrode has evaporation electric field intensity higher than that of the conductor.

According to another aspect of the present invention, in the method of manufacturing a carbon nanotube device, the conductor carried on the carrying electrode includes a particulate form.

According to another aspect of the present invention, in the method of manufacturing a carbon nanotube device, the conductor includes a particle containing titanium.

According to another aspect of the present invention, in the method of manufacturing a carbon nanotube device, the carbon nanotube includes a multi-wall carbon nanotube.

According to another aspect of the present invention, in the method of manufacturing a carbon nanotube device, the carbon nanotube includes a single-wall carbon nanotube.

According to another aspect of the present invention, in the method of manufacturing a carbon nanotube device, the end of the carrying electrode carrying the conductor is pointed.

According to another aspect of the present invention, in the method of manufacturing a carbon nanotube device, the connecting step further includes heating the conductor at the connection part to carbonize the conductor.

According to another aspect of the present invention, in the method of manufacturing a carbon nanotube device, the connecting step includes using a scanning probe microscope.

According to another aspect of the present invention, a carbon nanotube device having at least an inner electrode and a carbon nanotube electrically connected thereto, includes a conductive particle which electrically connects the inner electrode to the carbon nanotube therethrough.

According to another aspect of the present invention, the carbon nanotube device having at least an inner electrode and a carbon nanotube, manufactured by the method of manufacturing a carbon nanotube device, includes a conductive particle which electrically connects the inner electrode to the carbon nanotube therethrough.

Therefore, according to the present invention, it is possible to provide a method of manufacturing a carbon nanotube device including connecting a carbon nanotube to an electrode which can connect them with good and high reproducibility. It is also possible to provide a carbon nanotube device having a good ohmic contact. A carbon nanotube device with ohmic contact.

Note that, the "inner electrode" as used herein refers to an electrode which is included in a carbon nanotube device and electrically connected to the carbon nanotube therein. On the other hand, the "carrying electrode" as used herein refers to an electrode which is used in the method of the present invention for arranging the conductor at the connection part at which the carbon nanotube and the inner electrode are connected to each other or periphery thereof and is conceived to be a kind of tool for manufacturing a carbon nanotube device. Therefore, the "carrying electrode" does not have to be included in a finally obtained carbon nanotube device.

BRIEF DESCRIPTION OF THE DRAWINGS

A preferred embodiment of the present invention will be described in detail based on the accompanying drawings, wherein.

DETAILED DESCRIPTION OF THE PREFERRED EMBODIMENT

In the method of manufacturing a carbon nanotube device according to the present invention, carbon nanotube devices, which are objectives to be manufactured are devices in general which include a carbon nanotube as a material for the device and encompass all the devices ranging from those which use only carbon nanotubes and can be employed as transistors, diodes, leads, etc. because of their electric properties to those in which carbon nanotubes themselves constitute apart thereof and which as a whole exhibit various electric functions. In any case, in order to operate as a device, an electric connection between a carbon nanotube and an electrode is required. The method of manufacturing a carbon nanotube device according to the present invention is characterized by a connecting process of the electrodes.

connecting the carbon nanotube to the electrodes is required for establishing their continuity The connecting process in the method of the present invention is classified into at least a conductor attaching step, an arranging step, an approaching step, and a transferring step. It may further include a heating step as needed.

Hereafter, the connecting process according to one embodiment of the present invention will be explained on each of the above-mentioned steps as subordinate concepts. Note that in this embodiment, a scanning probe microscope (SPM) (scanning tunneling microscope (STM)) is used. A scanning probe microscope is useful for use in the method of the present invention since it can be operated while allowing observation of an objective on the order of nano meter and in addition the probe of STM can be used as an carrying electrode of the carbon nanotube device of the present invention.

(Electric Conductor Attaching Step)

The conductor attaching step includes attaching a conductor to an end of a needle-shaped or rod-shaped carrying electrode or periphery of that end.

Figure 1:
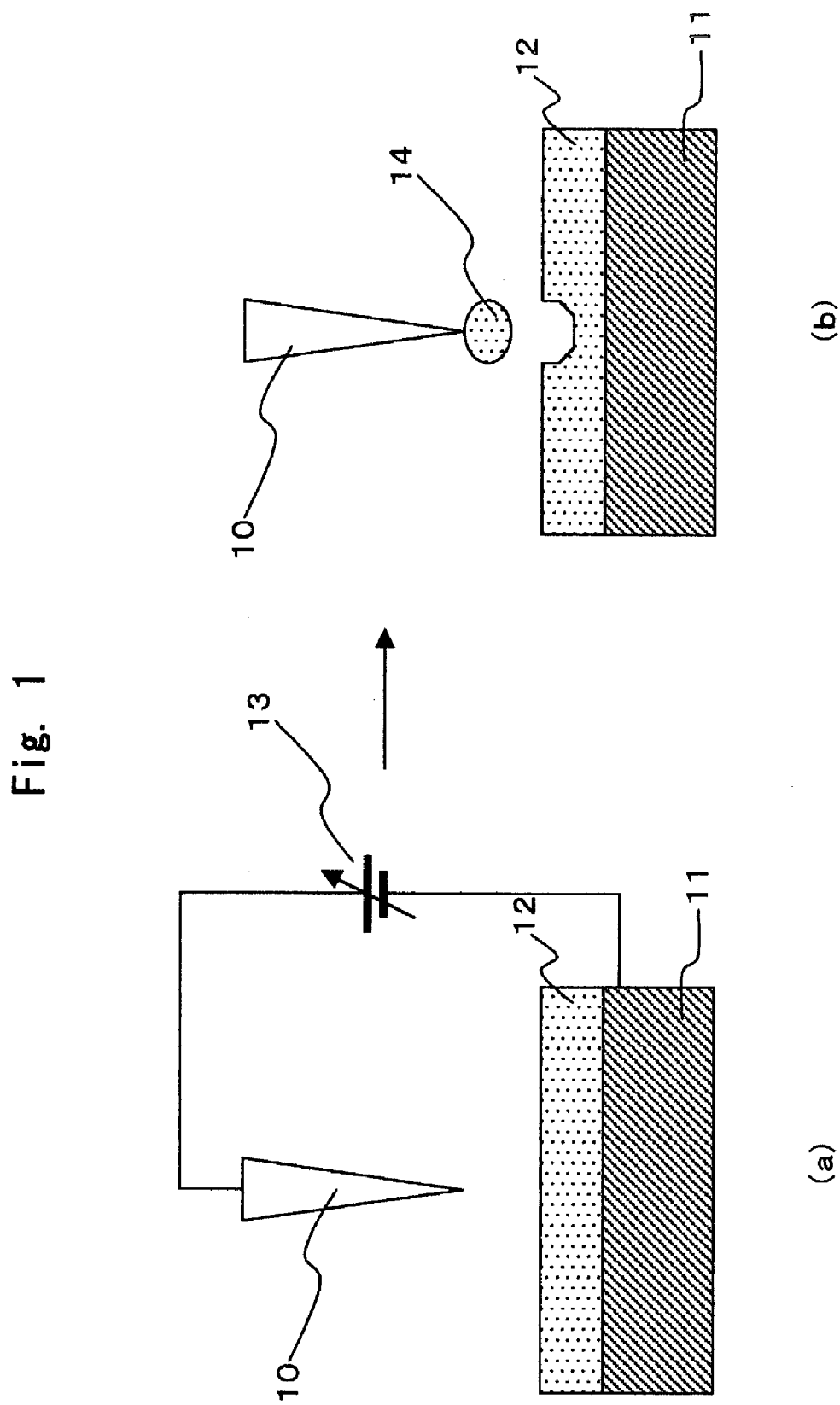
FIGS. 1A and 1B are schematic explanatory views illustrating a step of attaching a conductor by the method according to the present invention.

FIGS. 1A and 1B are schematic diagrams explaining the conductor attaching step in the method of the present invention. In FIGS. 1A and 1B, reference numeral 10 stands for a tungsten probe for an STM. The tungsten probe 10 is arranged opposite to a titanium thin film 12 formed on a surface of an appropriate substrate 11, with one end of the tungsten probe 10 being close to the titanium thin film 12. The distance between the tungsten probe 10 and the titanium thin film 12 is desirably such that they are close enough to cause the electric field evaporation described later on. Specifically, the distance is set appropriately depending on applied voltage and the kinds of the various materials used, etc.

Figure 2:
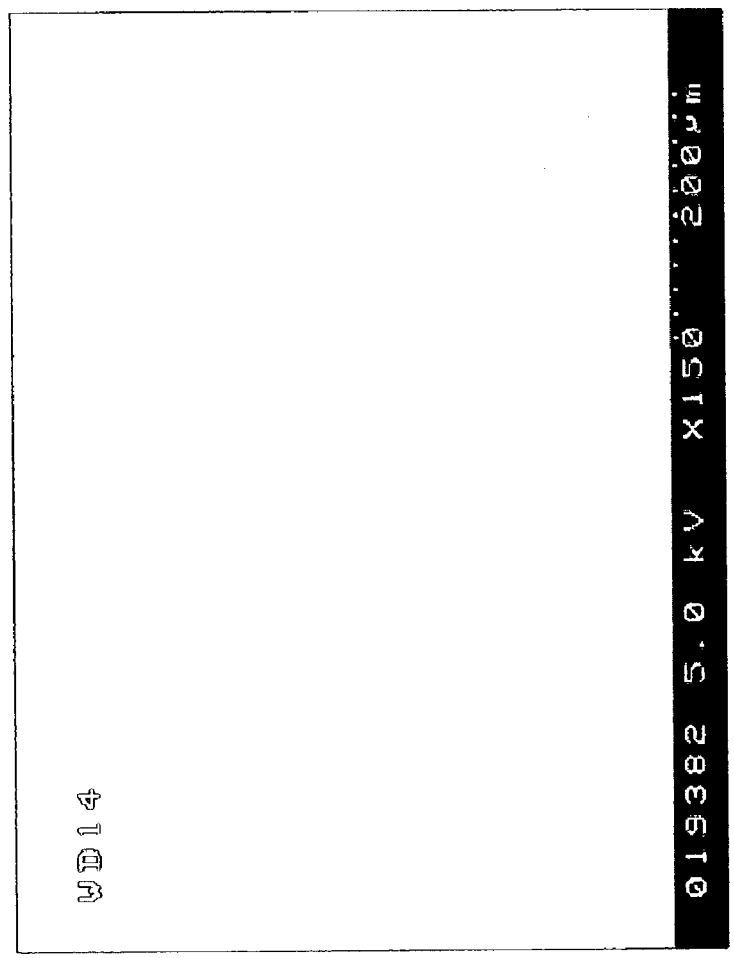
FIG. 2 is a scanning electron microscopic (SEM) photograph (magnified by a factor of 150) of a tungsten probe with a sharpened end formed by electro chemical etching.

In this embodiment, the tungsten probe 10 is used as an carrying electrode. However, the present invention should not be considered to be limited thereto and any carrying electrode may be used without causing problems as long as it is made of a needle-shaped or rod-shaped conductor. It is desirable, however, that the end of the carrying electrode to which a conductor is attached is sharpened. The method of sharpening the end of an carrying electrode is not particularly limited and a known method such as electro chemical etching may be used. FIG. 2 is a scanning electron microscopic (SEM) photograph (magnified by a factor of 150) of the tungsten probe 10, with its end being sharpened by electrolytic etching. Note that the above-mentioned magnification may involve some errors due to a condition in which the picture is enlarged, etc.; hereinafter the same will be applicable to SEM photographs.

The titanium thin film 12 is a conductor attached to an end of the tungsten probe 10, which serves as an carrying electrode, or periphery of that end. In this embodiment, titanium is used as the conductor. However, the present invention is not limited thereto and various metals may be used. Among the metals, titanium, scandium, vanadium, and alloys containing one or more of these metals are preferred, with titanium being particularly preferred.

Figure 3:
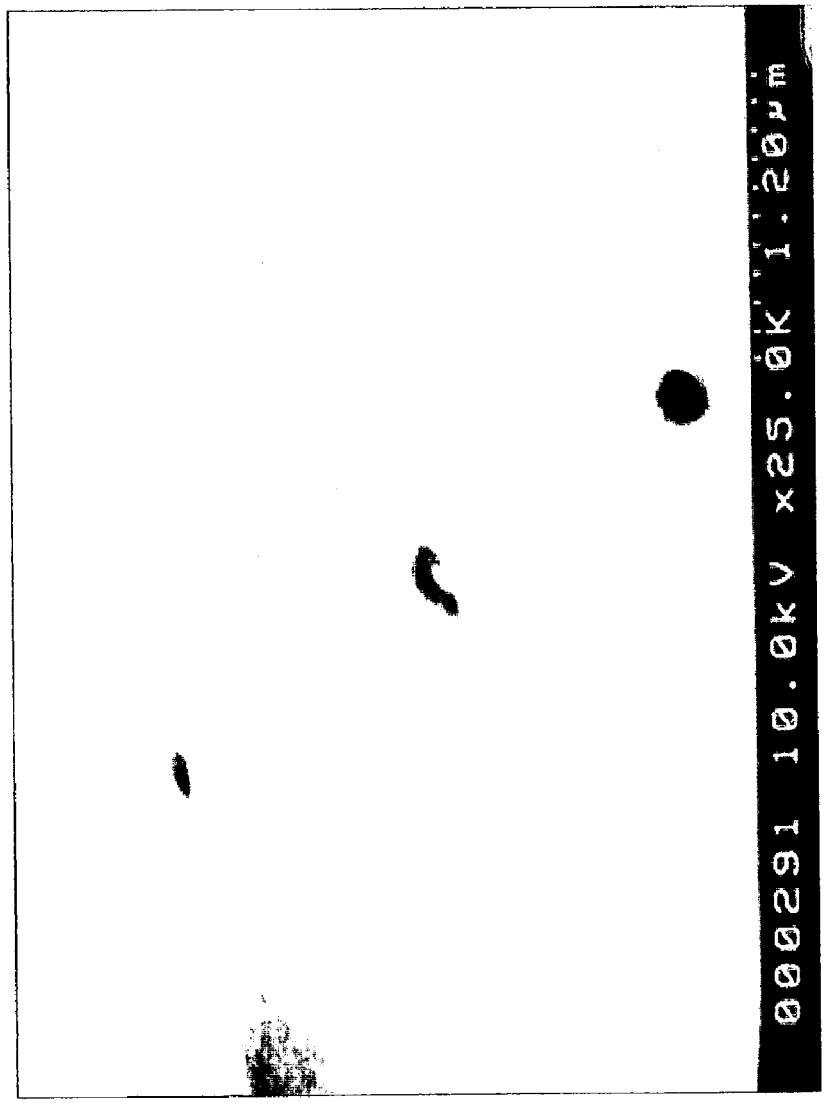
FIG. 3 is a scanning electron microscopic (SEM) photograph (magnified by a factor of 25,000) of a surface of a titanium thin film with pits formed therein by electric field evaporation.

As shown in FIG. 1A, a power unit 13 is connected between the tungsten probe 10 and the substrate 11 such that the tungsten probe 10 and the substrate 11 serve as a positive electrode and a negative electrode, respectively. Then, application of a direct-current voltage from the power unit 13 converts the titanium thin film 12 into particles by electric field evaporation, which are attached to the end of the tungsten probe 10 or periphery thereof as titanium particles 14 as shown in FIG. 1B. In this instance, the titanium is transferred from the surface of the titanium thin film 12 to the tungsten probe 10, so that there is formed a pit in the surface of the titanium thin film 12. FIG. 3 is an electron microscopic photograph (magnified by a factor of 25,000) of a surface of the titanium thin film 12 with pits formed by electric field evaporation.

As the voltage applied between the tungsten probe 10 and the substrate 11, for example, pulse voltage of a rectangular waveform is used. Specifically, the magnitude of the voltage is set appropriately depending on the distance between the tungsten probe 10 and the titanium thin film 12, the thickness of the probe, the kinds of various materials used, etc. Appropriate selection of these factors makes it possible to control the amount (particle diameter) of the conductor (titanium particles 14) which will attach to the tungsten probe 10.

It is desirable that materials less susceptible to electric field evaporation than the conductor be used for the carrying electrode. Use of an carrying electrode less susceptible to field evaporation than the conductor makes it possible to effectively attach the conductor to the end of the carrying electrode or periphery of that end by application of electric field. As an index for the degree to which electric field evaporation is difficult to occur, an intensity of electric field at which field evaporation occurs (hereafter, simply referred to as "evaporation field intensity") may be adopted. The evaporation electric field intensity can be expressed by formula (1) below.

Formula (1) Formula for calculation of evaporation electric field intensity $$F_{ev} \approx \frac{1}{nr_0}\left[\Lambda + \sum_{i=1}^{n} I_i - n\Phi - \frac{3.6n^2}{r_0} - \frac{3.6n^2}{(d-r_0)} - kT\ln\left(\frac{\nu}{\kappa}\right)\right]$$

In the formula (1) above, $F_{ev}$ represents evaporation electric field intensity, $\Lambda$ represents a bonding force with substrate atoms, $I_n$ represents ionization energy for an n-valent ion, $\phi$ represents a work function, $r_0$ represents the radius of an atom, and d represents the distance between the tip of an carrying electrode and the surface of the sample.

Accordingly, it is preferred that the evaporation electric field intensity of the carrying electrode be greater than that of the conductor.

In relation to the evaporation electric field intensity $F_{ev}$, calculated by the formula (1) above, the relationship between titanium and the other metals used as the conductors in this embodiment is shown in Table 1 below.

TABLE 1

| Evaporation electric field intensity | | |
|---|---|---|
| | V/Å  ← $Ti^{2+}$ | V/Å |
| $Al^+$ | 0.81 | 1.17 |
| $Zn^-$ | 1.01 | |
| $Au^-$ | 1.71 | |
| $Fe^{2+}$ | 1.73 | Calculated from formula (1) |
| $Ge^{2+}$ | 1.78 | |
| $Cu^+$ | 1.78 | |
| $Ni^{2+}$ | 1.97 | |
| $Co^{2+}$ | 2.07 | |
| $Si^{2+}$ | 2.26 | |
| $Mo^{2+}$ | 2.67 | |
| $Pt^{2+}$ | 3.08 | |
| $W^{3+}$ | 3.37 | |
| $C^-$ | 4.79 | |

Physical Review B, 1991, vol. 44, 13703

Table 1 above indicates that the tungsten used as an carrying electrode in this embodiment has a sufficiently high evaporation electric field intensity $F_{ev}$ as compared with the titanium used as the above-mentioned conductor.

In this embodiment, titanium particles 14 are attached to the tungsten probe 10. In the present invention, it is desirable that a conductor to be attached to the carrying electrode be in a particulate form. Use of a conductor in a particulate form realizes a good ohmic contact with a high reproducibility when it is transferred in the transferring step described later on. Note that the conductor does not have to be a single particle; it may be a cluster-shaped conductor composed of plural particles.

(Arranging Step)

The arranging step is a step of arranging a carbon nanotube at a predetermined connection part on the inner electrode of a device such that it is arranged in contact or close to the inner electrode. The "connection part" as used herein means a site on the inner electrode at which a carbon nanotube is to be connected. Upon arrangement, they are not required to completely come in contact with each other and it is only needed that both are arranged close enough to be finally connected to each other with the method of the present invention.

The carbon nanotube that can be used in the present invention may be either a multi-wall carbon nanotube (MWNT) or a single-wall carbon nanotube (SWNT). Any carbon nanotube that is suitable for use as a device may be selected. Cones (nanohorns), nanobeads, nanocoils, nanotubes with a varying tube diameter in the longitudinal direction, etc., which are known as variations of carbon nanotubes, are also included in the concept of the carbon nanotubes as referred to herein and they can be also used as appropriate.

Figure 4:
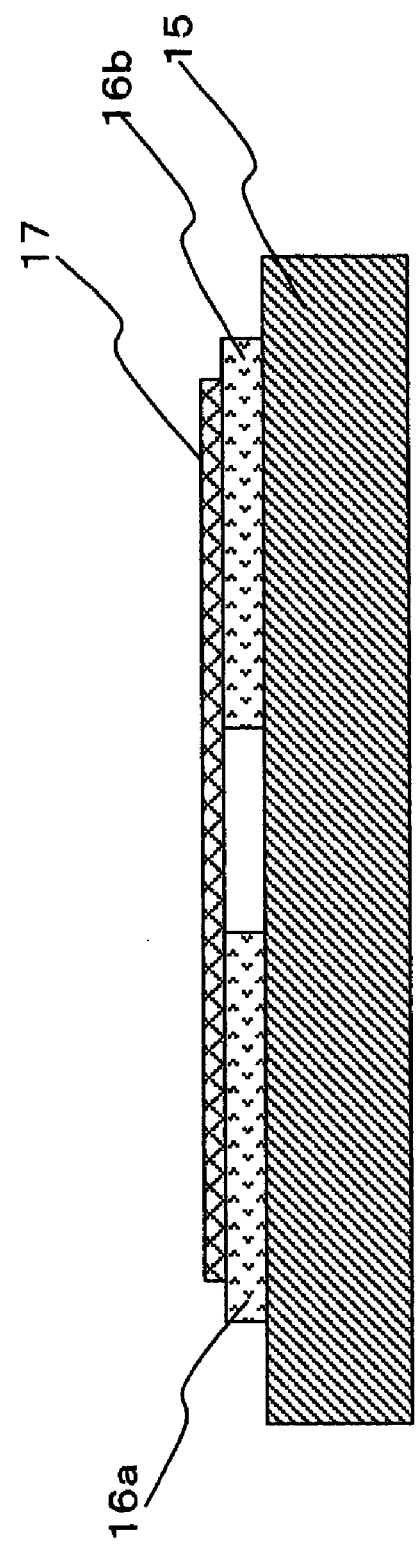
FIG. 4 is a schematic cross-sectional view schematically showing a condition, in which a carbon nanotube is arranged on surfaces of titanium electrodes formed on a surface of a substrate in an arranging step for a carbon nanotube by the method according to the present invention.

FIG. 4 is a schematic cross-sectional view schematically showing a condition in which the carbon nanotube 17 is arranged on the surfaces of the titanium electrodes 16a and 16b serving as inner electrodes, respectively, formed on a surface of the substrate 15 such as a silicon wafer. The contact or close arrangement between the carbon nanotube and the inner electrode is achieved by simply mounting the carbon nanotube 17 on the surfaces of the titanium electrodes 16a and 16b, respectively, in this way. By use of a scanning probe microscope, the arrangement operation can be readily performed.

In this embodiment, the titanium electrodes 16a and 16b are used as inner electrodes. However, the present invention should not be considered to be limited thereto.

(Approaching Step)

The approaching step is a step of allowing the end of the carrying electrode on which the conductor is carried to approach the connection part. The distance between the end of the carrying electrode and the connection part is desirably small enough to cause the electric field transfer described later on. Specifically, the distance is set depending on the applied voltage, the kinds of various materials used, etc. as appropriate.

Figure 5:
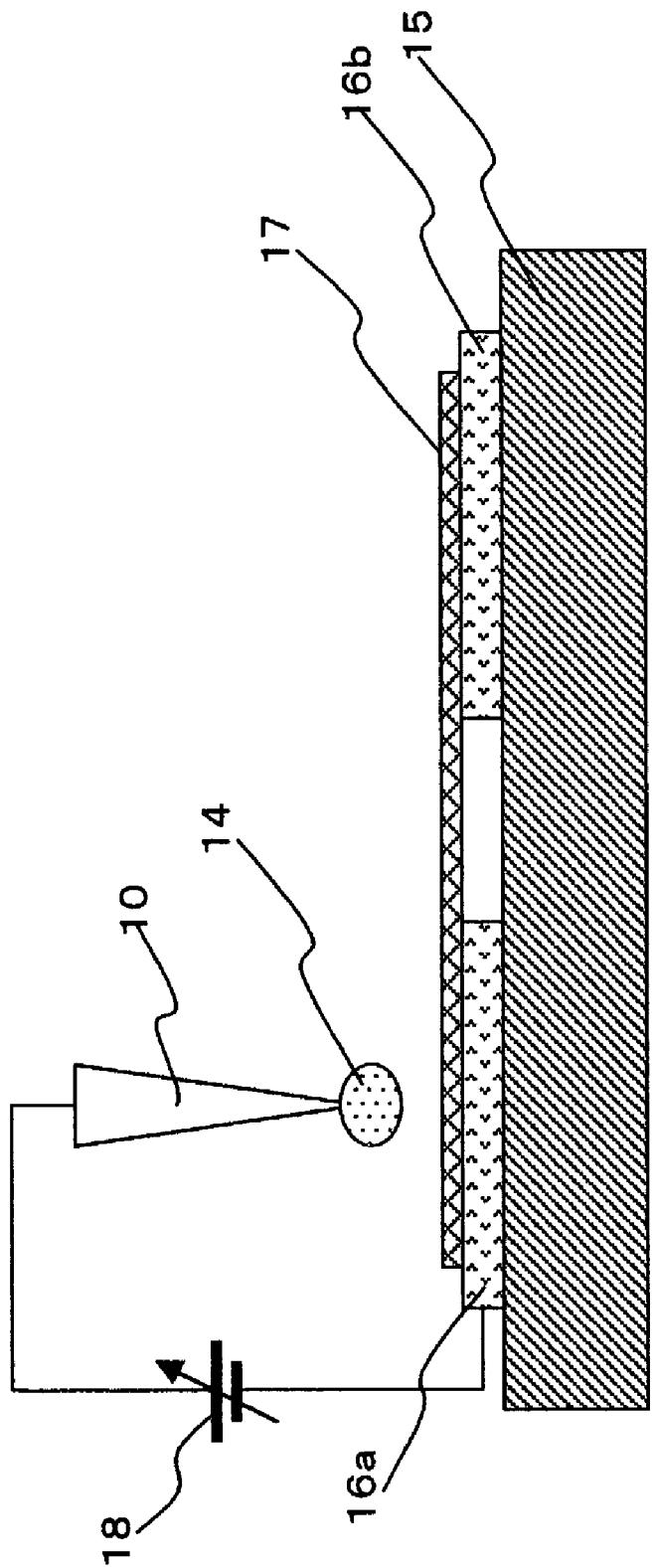
FIG. 5 is a schematic cross-sectional view schematically showing a condition, in which a tungsten probe with a titanium particle attached to an end thereof approaches the connection part at which a titanium electrode and a carbon nanotube are connected to each other in a state where the carbon nanotube is arranged on a surface of the titanium electrode in an approaching step by the method according to the present invention.

FIG. 5 is a schematic cross-sectional view showing schematically a condition in which the tungsten probe 10, to one end of which the titanium particles 14 are attached by performing the operation of the conductor attaching step as described above with reference to FIG. 1, is positioned close to the connection part at which the titanium electrodes 16a and 16b and the carbon nanotubes 17 are connected, which are in the condition as shown in FIG. 4, where the carbon nanotube 17 is arranged on the surfaces of the titanium electrodes 16a and 16b by performing the operation of the above-mentioned arranging step. In FIG. 4, two connection parts are expected: one on the titanium electrode 16a and the other on the titanium electrode 16b. FIG. 5 shows a condition in which the tungsten probe 10 is positioned close to the connection part at which the titanium electrode 16a and the carbon nanotube 17 are connected. It is needless to say that when a connection is intended to be made between the titanium electrode 16b and the carbon nanotube 17, the tungsten probe 10 will be positioned close to the connection part concerned.

Furthermore, as shown in FIG. 5, a power unit 18 is connected between the tungsten probe 10 and the titanium electrode 16a such that the tungsten probe 10 will serve as a positive electrode and the titanium electrode 16a will serve as a negative electrode.

(Transferring Step)

The transferring step is a step of moving the above-mentioned conductor carried on the carrying electrode to the above-mentioned connection part or periphery thereof to connect the carbon nanotube to the inner electrode. The "connection part or periphery thereof" indicates areas including the site in the inner electrode to which connection of a carbon nanotube is intended and periphery thereof as well as the site of the carbon nanotube which contacts the connection part and periphery thereof.

The transferring step may adopt any techniques as long as they can move the above-mentioned conductor attached to the carrying electrode to the above-mentioned connection part or periphery thereof; application of a voltage between the carrying electrode and the inner electrode to generate the electric force in the electric field, by which the conductor attached to the carrying electrode is moved to the above-mentioned connection part, is preferable.

That is, in FIG. 5, application of a direct-current voltage between the tungsten probe 10 and the titanium electrode 16a from the power unit 18 generates an electric force in the electric field, which moves the titanium particles 14 on the end of the tungsten probe 10 to the connection part between the titanium electrode 16a and the carbon nanotube 17. Performance of the operation in the transferring step results in a good ohmic contact of the titanium electrode 16a and the carbon nanotube 17 through the titanium particles at the connection part. Additionally performing this operation at the connection part at which the titanium electrode 16b and the carbon nanotube 17 is connected results in an ohmic contact between the titanium electrodes 16a and 16b and the carbon nanotube 17. Furthermore, various operations for fabricating a device are performed as needed to complete a carbon nanotube device according to the present invention.

Figure 6:
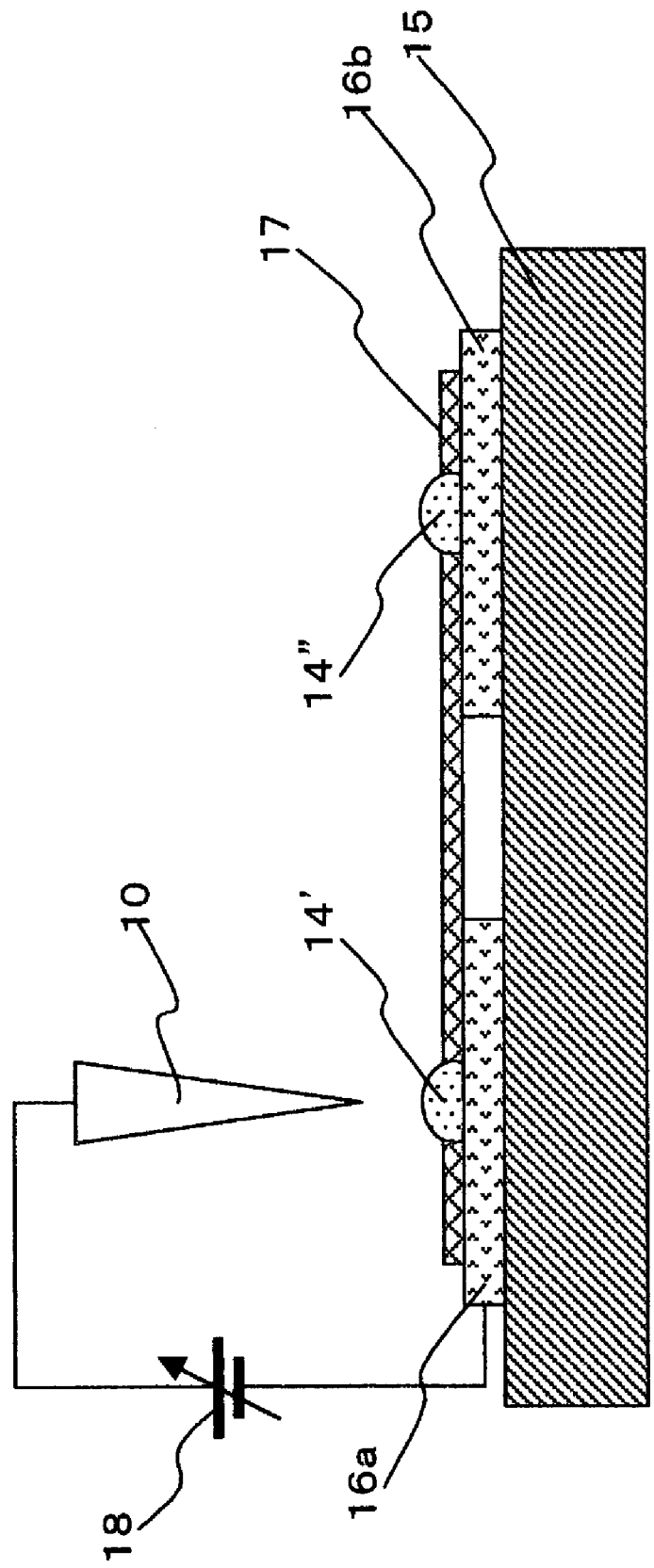
FIG. 6 is a schematic cross-sectional view schematically showing a condition, in which titanium electrodes are connected to a carbon nanotube through a titanium particle in a transferring step by the method according to the present invention.
Figure 7:
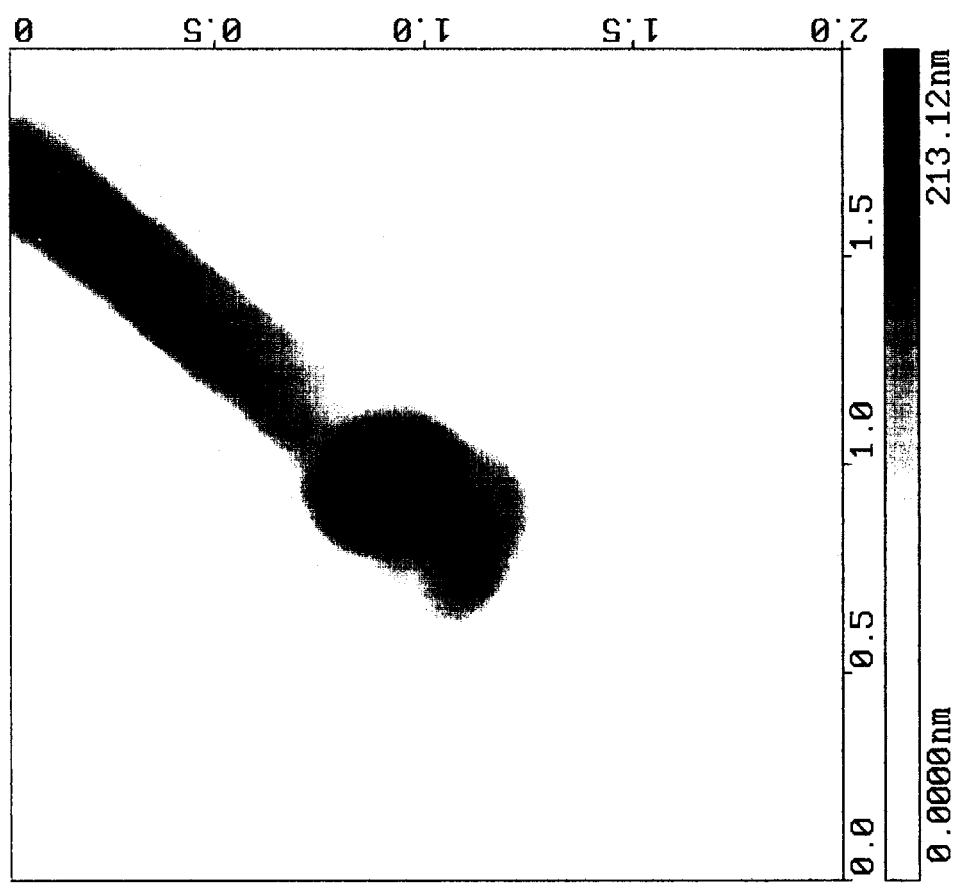
FIG. 7 shows an image of surface irregularities taken by an atomic force microscope (AFM) showing a condition, in which a titanium electrode and a carbon nanotube are connected to each other through a transferred titanium particle.
Figure 8:
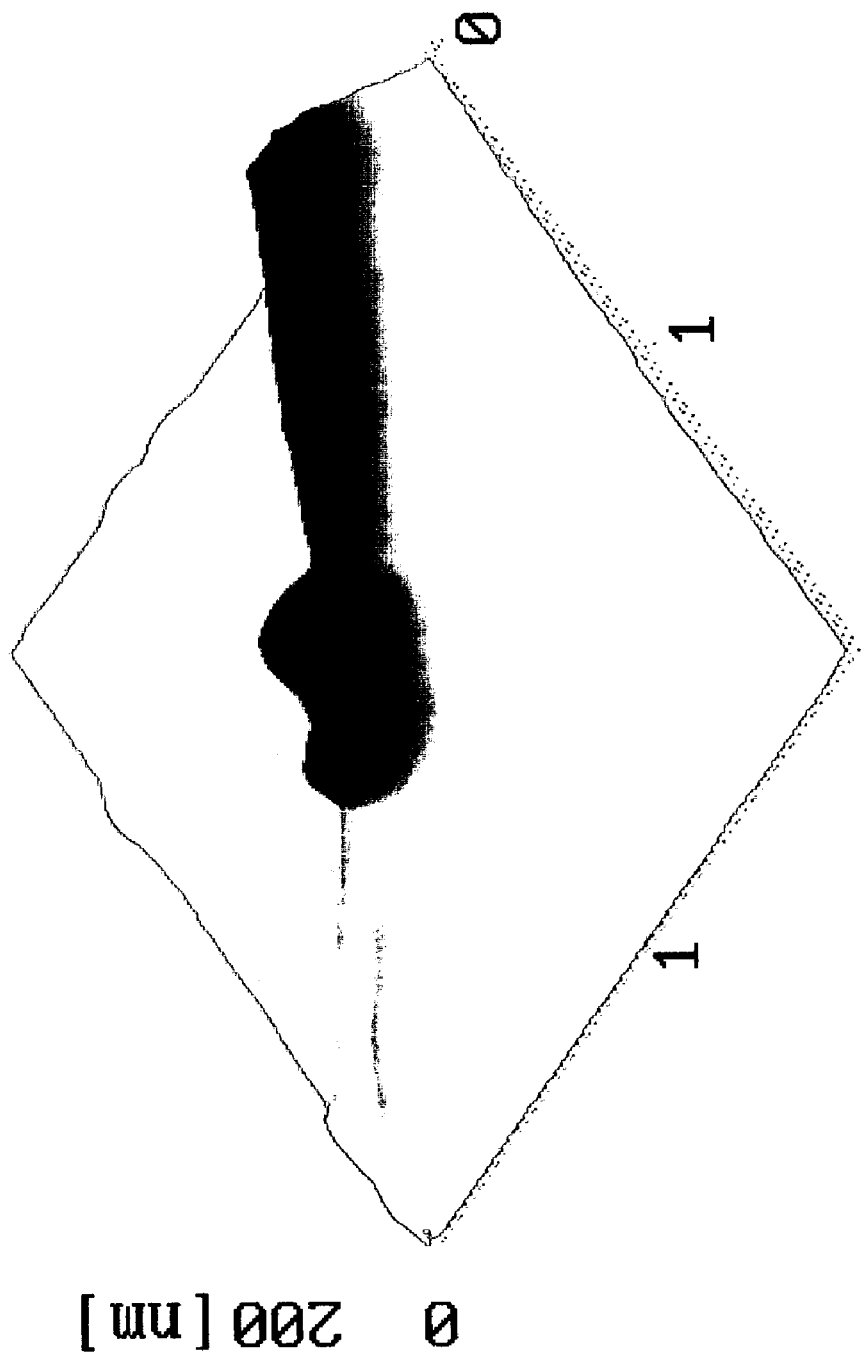
FIG. 8 shows a stereoscopic image of surface irregularities taken by an atomic force microscope (AFM) showing a condition, in which a titanium electrode and a carbon nanotube are connected to each other through a transferred titanium particle.
Figure 9:
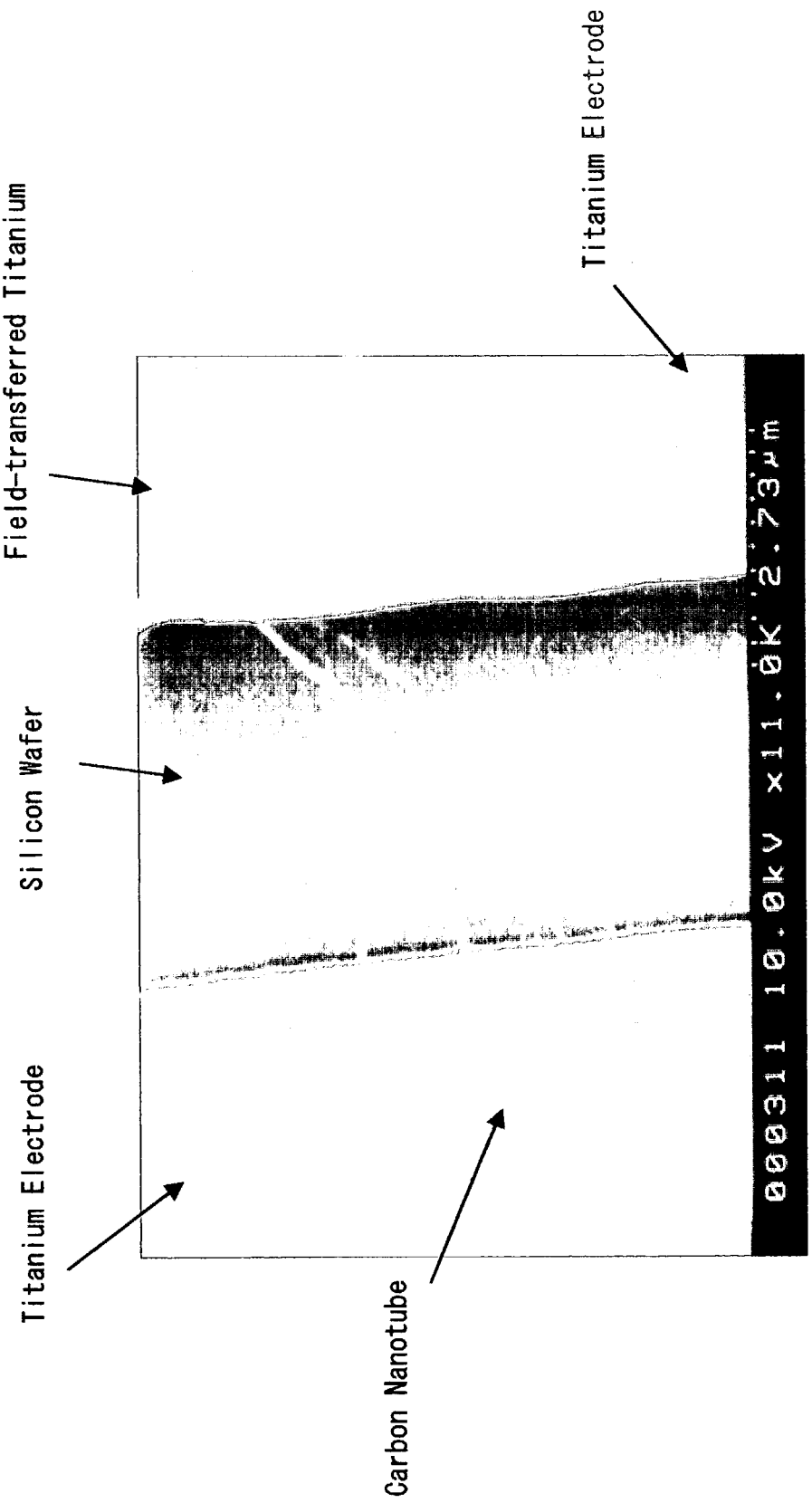
FIG. 9 shows an electron microscopic image taken by a scanning electron microscope (SEM) (magnified by a factor of 11,000) showing a condition, in which a titanium electrode and a carbon nanotube are connected to each other through a transferred titanium particle.

FIG. 6 is a schematic cross-sectional view showing schematically a condition in which the titanium electrodes 16a and 16b and the carbon nanotube 17 are connected through titanium particles 14' and 14", respectively. In addition, FIGS. 7 to 9 show electron microscopic photographs taken by various methods, showing a condition in which the titanium electrodes and the carbon nanotube are actually connected through transferred titanium particles. FIG. 7 shows an image of surface irregularities taken by using an AFM. FIG. 8 shows a stereoscopic image of surface irregularities taken by using an AFM. FIG. 9 shows an image taken by using an SEM (magnified by a factor of 11,000). As can be seen from these photographs, the titanium particles are transferred to the connection parts at which the titanium electrodes and the carbon nanotube are connected.

The voltage applied between the titanium electrodes 16a and 16b and the carbon nanotube 17 is preferably a pulse voltage (for example, rectangular wave). Specifically, magnitude of the voltage is set depending on the distance between the tungsten probe 10 and the above-mentioned respective connection parts, the kinds of various materials, etc., as appropriate.

Application of high pulse voltage may in some cases cause disappearance (evaporation) of the carbon nanotube itself. Therefore, it is desirable that a pulse voltage which is below such a voltage set as the upper limit, be applied. The phenomenon of disappearance (evaporation) is known as field evaporation and the intensity at which this phenomenon occurs is referred to as evaporation electric field intensity. In other words, in the transferring step, the intensity of electric field due to the voltage applied between the above-mentioned outer and inner electrodes is desirably lower than that of the threshold of evaporation electric field intensity of the carbon nanotube.

By performing each of the above-mentioned steps, the carbon nanotube device of the present invention is fabricated. The carbon nanotube device of the present invention is characterized by having at least one carbon nanotube electrically connected to an inner electrode and including conductive particles which electrically connect the inner electrode and the carbon nanotube to each other.

The characteristics of the technique of the present invention reside in the attachment of a conductor such as metal particles to an carrying electrode by a process such as application of voltage and in the transfer of the conductor to the connection part at which the carbon nanotube and the inner electrodes are connected by an operation such as application of voltage in combination. Merely applying a pulse voltage to the connection parts between the carbon nanotube and the inner electrode brings the inner electrode and the carbon nanotube to substantially the same potential, so that the effects of electric field are small. As a result, it is difficult to improve the ohmic property between the inner electrode and the carbon nanotube.

On the contrary, when a conductor is present therebetween as in the case of the present invention, electric field is applied between the surface of the carbon nanotube and the carrying electrode and between the inner electrode and the carrying electrode, respectively, so that first a portion of the foreign matter on the surface which would interfere the ohmic property is removed therefrom. Further, when the conductor is transferred, it is estimated that the surface of the carbon nanotube and the conductor as well as the inner electrode and the conductor are brought into contact, respectively, to become in a state of an ohmic contact, with the result that the electrical contact (ohmic property) between the surface of the carbon nanotube and the inner electrode is improved. In addition, it is also expected that the conductor will play a role of an adhesive, which will improve fixation property.

Furthermore, the effect of acceleration by electric field is exhibited; it is expected that the electrical contact (ohmic property) between the conductor and the carbon nanotube or substrate electrode will be improved.

Besides the titanium particles, improvement of the ohmic property is possible by use of, for example, gold particles as a conductor. However, use of titanium particles ensures ohmic contacts with an improved reproducibility. Although the reason for this is not clear enough, it is expected that when the carbon nanotube contacts the titanium particles accelerated by the electric field, chemical bonds (covalent bonds upon formation of titanium carbide) be generated between the surface of the carbon nanotube and the titanium particles.

Note that with regard to the particle formation by electric field evaporation using an STM probe, "Physical Review Letter, 1990 vol. 65 2418", "Physical Review B, 1991 vol. 44 13703", "Japan Journal of Applied Physics, 1994, vol. 33, L1358", and "Japan Journal of Applied Physics, 1999, vol. 38, 3863" describe methods in which a metallic material is field-evaporated to the side of a substrate to form particles on the substrate. By using these methods, conductive particles as a conductor, can be attached to the carrying electrode. Among the four documents described above, the former three disclose examples of mainly using gold as a particle forming material. The last one of the documents discloses an example of using nickel as a particle forming material.

(Heating Step)

When a material to be carbonized is used in the present invention as a conductor (conductive particle), an operation of a heating step may be performed additionally after the carbon nanotube and the inner electrode are connected to each other by the transferring step to make a physical connection between the carbon nanotube and the inner electrode stronger. The heating step is not essential in the present invention. In many cases, even the transferring step alone can give rise to sufficiently strong connections.

Here, the heating step means a step of carbonizing the conductor at the connection parts.

When heating is performed, by carbonization of a conductor and a carbon nanotube proceeds in the same manner as in the conventional technology. However, depending on the kind of carbon nanotube, the carbon nanotube may in some cases be destructed due to the heat, so that it is desirable that attention be paid to the heating temperature and heating time.

Figure 10:
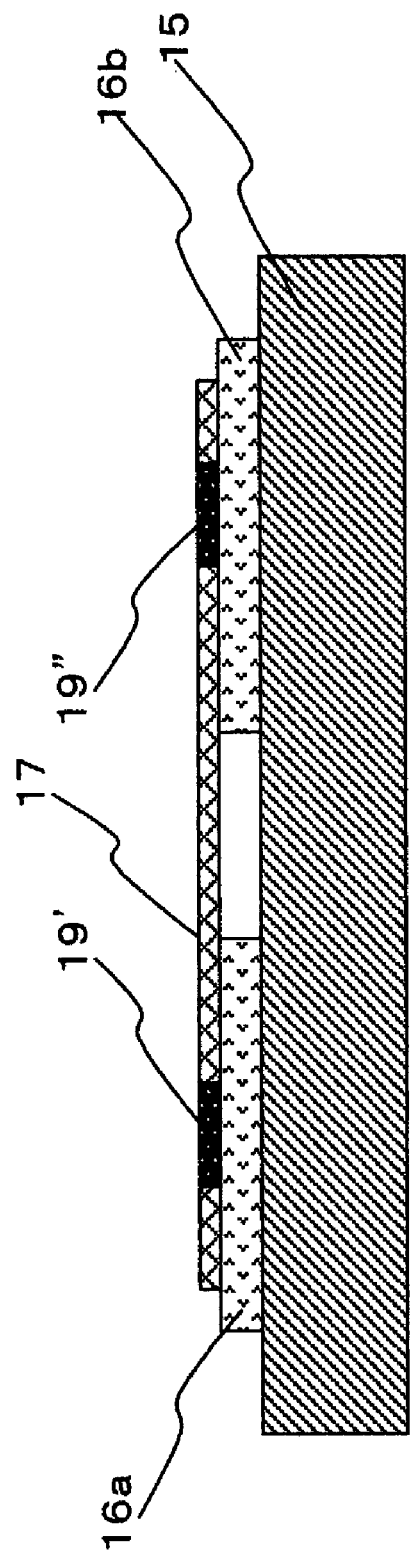
FIG. 10 is a schematic cross-sectional view schematically showing a condition, in which a carbon nanotube is connected to inner electrodes after an operation of a heating step.

FIG. 10 is a schematic cross-sectional view schematically showing a condition in which the carbon nanotube 17 after performing an operation of the heating step thereon and the titanium electrodes 16a and 16b as the inner electrodes are connected to each other. The titanium particles 14' and 14" are carbonized into titanium carbides 19' and 19", respectively, which makes the physical connection between the carbon nanotube 17 and the titanium electrodes 16a and 16b stronger.

EXAMPLE

Hereinafter, the present invention will be described in more detail by examples. However, the present invention should not be considered to be limited to the following examples.

<Common Experimental Condition>

Figure 11:
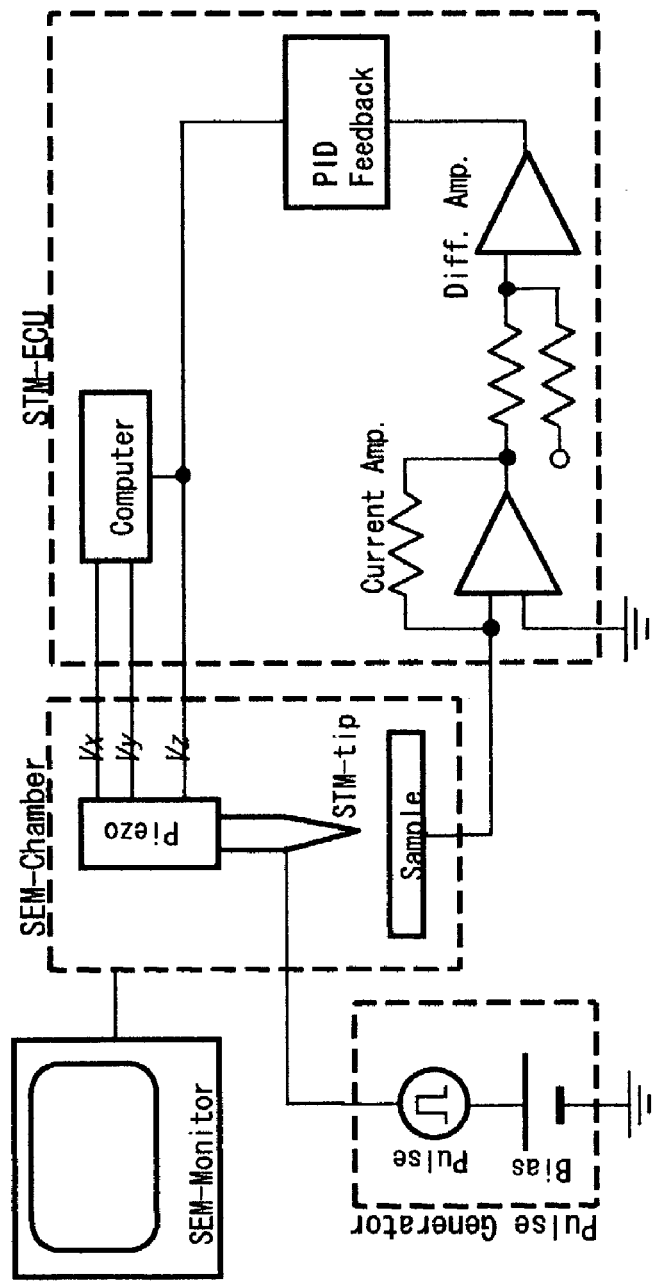
FIG. 11 is a schematic block diagram showing a schematic configuration of an SEM/STM combined apparatus used in examples of the present invention.

Apparatus used in the experiments: SEM/STM composite apparatus (SEM, S-4500, manufactured by Hitachi, Ltd.; STM: TopoMetrix AtomTracer). FIG. 11 shows an outline of its structure.

Pulse applying apparatus: HP8114A, manufactured by Hewlett-Packard Company.

Processing conditions:

Tunneling current value at the time of approaching . . . 0.5 nA

Bias voltage . . . 1 V (pulse voltage is superposed on the bias voltage with the feedback circuit remaining connected).

Substrate used: A silicon wafer with a 500-nm oxide film.

Degree of vacuum: $-10^{-6}$ Torr ($-1.33 \times 10^{-4}$ Pa).

Example 1

(Sharpening of Probe)

A tungsten-made wire of 250 μm in diameter was provided as a tungsten probe (carrying electrode). By applying a voltage with a potential difference of 1.4 V between the tungsten probe used as a positive electrode side and platinum (negative electrode) used as a counter electrode, electrolytic etching was performed in an alkali solution of 0.25-N KOH (regulation) for about 5 minutes to sharpen one end of the probe to a condition shown in the photograph of FIG. 2.

(Electric Conductor Attaching Step . . . Attachment of Titanium Particles from Titanium Thin Film to End of Probe)

As shown in FIG. 1A, the substrate 11 having formed on the surface thereof the titanium thin film 12 with a thickness of 500 angstroms was provided to cause the tungsten probe 10 to approach the surface of the titanium thin film 12 up to a distance of 6 angstroms therefrom, with subsequent application of a voltage of 10 V (pulse voltage with pulse width of 150 μsec in a rectangular waveform). As a result, as shown in FIG. 1B, a pit was formed in the titanium thin film 12 just below the lower part of the tungsten probe 10 and the titanium particle 14 was attached to the end of the tungsten probe 10. The condition in which a pit was formed in the titanium thin film 12 is as shown in the SEM photograph in FIG. 3.

(Arranging Step)

As shown in FIG. 4, the carbon nanotube 17 was mounted on the surfaces of the titanium electrodes 16a and 16b made of titanium thin films, respectively, by using a scanning probe microscope (SPM)

(Approaching Step and Transferring Step)

The tungsten probe 10 with the titanium particle 14 attached was arranged at the connection part at which the titanium electrode 16a and the carbon nanotube 17 formed on the titanium electrode 16a was connected so as to approach it at a distance of 6 angstroms from the surface of the titanium electrode 16a. In this state, application of pulse voltage was performed under the conditions of applied voltages of 6 V and 12 V, respectively.

At an applied voltage of 6 V, neither movement of the titanium particles 14 nor improvement of the ohmic property was observed. At an applied voltage of 12 V, however, the titanium particles moved to the side of the substrate 15 (i.e., the connection part at which the titanium electrode 16a and the carbon nanotube 17 were connected or periphery thereof), showing a great improvement in the ohmic property.

This operation was performed also at the connection part at which the titanium electrode 16b and the carbon nanotube 17 formed on the titanium electrode 16b were connected. As a result, the transfer of the titanium particles 14' and 14" occurred to connect the titanium electrodes 16a and 16b to the carbon nanotube 17 as shown in FIG. 6.

Figure 12B:
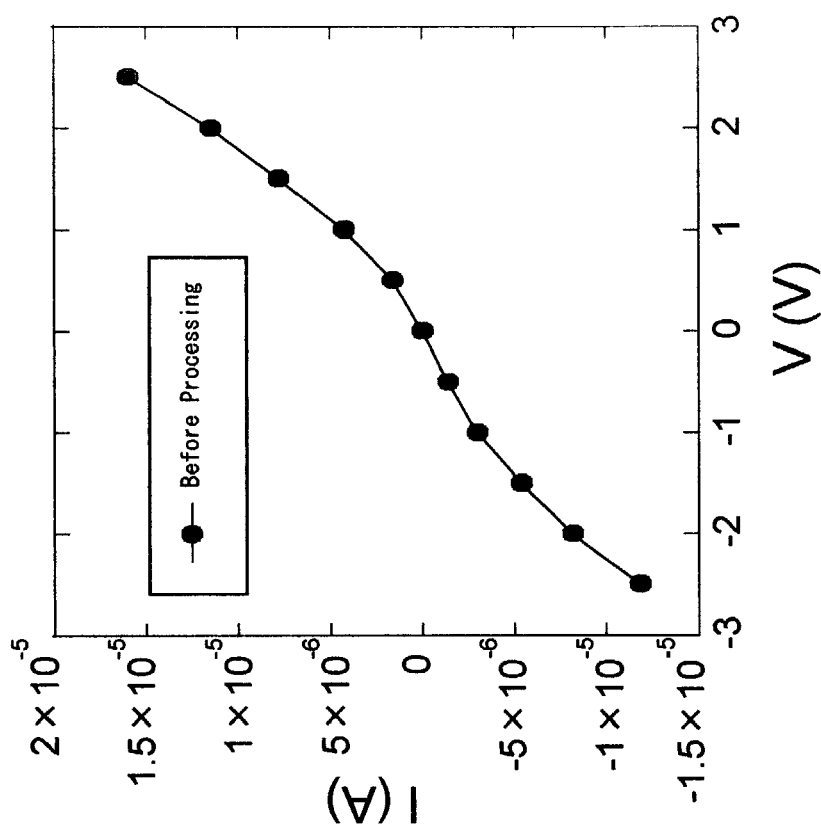
FIG. 12B is graph on an enlarged scale showing the electrical properties of a carbon nanotube device before processing.
Figure 12A:
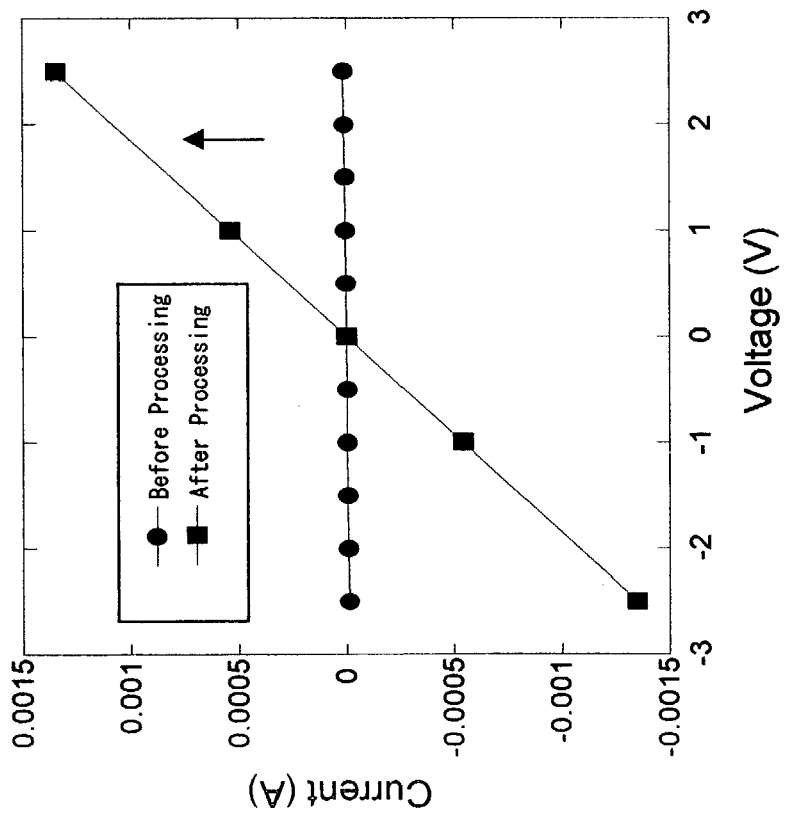
FIG. 12A is a graph comparing electrical properties of a carbon nanotube device between a condition in which the electrodes are connected to the carbon nanotube in accordance with an example of the present invention (after processing) and a condition in which the carbon nanotube is simply brought into a physical contact with the electrodes (before processing)

FIG. 12A is a graph comparing the electrical properties of a carbon nanotube device between a condition in which an electrode is connected to a carbon nanotube according to this example (i.e., the condition shown in FIG. 6; after processing) and a condition in which a carbon nanotube is simply brought into a physical contact with an electrode (i.e., the condition as shown in FIG. 4; before processing), and FIG. 12B is graph on an enlarged scale showing the electrical properties of a carbon nanotube device before processing. The graph shown in FIG. 12A and FIG. 12B also shows that the carbon nanotube 17 and the electrodes were in a good ohmic contact according to this example.

Example 2

The sample obtained in Example 1 was subjected to heat treatment at 800° C. in ultra high vacuum to perform the step of heating. This caused the titanium particles and carbon nanotube to be chemically combined, resulting in the carbonization of titanium to form titanium carbides 19' and 19" (FIG. 10).

It was confirmed that the obtained carbon nanotube device like that obtained in Example 1 had a good ohmic property. Use of carbon nanotubes with many defects or those with the catalyst remained therein often gave results destroying the carbon nanotubes themselves.

Comparative Example 1

By using a tungsten probe to which no attachment of titanium particles to the end of the probe from a titanium thin film by the step of attaching a conductor was performed, the operations subsequent to the arrangement step were performed in the same manner as in Example 1. Application of pulse voltage in the transferring step was performed under the conditions of applied voltages of 4 V, 6 V, 8 V, 10 V, 12 V, and 15 V, respectively.

At the applied voltages of from 4 V to 12 V, no change was observed. That is, up to 12 V, no improvement in the ohmic property established between the gold electrode and the carbon nanotube was made. In addition, at the applied voltage of 15 V, the destruction (breakage) of the carbon nanotubes was often observed. As for the condition of connection, at the applied voltage of 15 V, there were both of the case where the ohmic property between the titanium electrodes 16a and 16b and the carbon nanotube 17 was improved and the case where no improvement was obtained. This is considered to be attributable to the existence of some destructed carbon nanotubes 17, so that the electrodes and the carbon nanotube are physically apart from each other or a reduction in contact area therebetween occurs.

What is claimed is:

1. A method of manufacturing a carbon nanotube device including an inner electrode, the method having a connecting step that connects a carbon nanotube to the inner electrode, wherein the connecting step comprises:

attaching a conductor in a particulate form to an end or periphery thereof of a needle-shaped or rod-shaped carrying electrode;

arranging the carbon nanotube in contact with or close to a predetermined connection part of the inner electrode;

approaching the end of the carrying electrode on which the particulate form conductor is carried to the connection part; and transferring the particulate form conductor carried on the carrying electrode to the connection part or periphery thereof to connect the carbon nanotube to the inner electrode.

2. The method of manufacturing a carbon nanotube device according to claim 1, wherein the transferring step comprises applying a voltage between the carrying electrode and the inner electrode to generate an electric force in an electric field therebetween, by which the conductor carried on the carrying electrode is transferred to the connection part.

3. The method of manufacturing a carbon nanotube device according to claim 2, wherein the carrying electrode has evaporation electric field intensity higher than that of the conductor.

4. The method of manufacturing a carbon nanotube device according to claim 2, wherein the voltage applied between the carrying electrode and the inner electrode in the transferring is a pulse voltage.

5. The method of manufacturing a carbon nanotube device according to claim 4, wherein the carrying electrode has evaporation field intensity higher than that of the conductor.

6. The method of manufacturing a carbon nanotube device according to claim 1, wherein the transferring step comprises applying a voltage between the carrying electrode and the inner electrode to generate an electric force in an electric field therebetween, by which the conductor carried on the carrying electrode is transferred to the connection part, wherein, in the transferring step, the voltage applied between the carrying electrode and the inner electrode is a pulse voltage, and wherein electric field intensity caused by the voltage is lower than a threshold of evaporation electric field intensity of the carbon nanotube.

7. The method of manufacturing a carbon nanotube device according to claim 1, wherein the conductor comprises a particle containing titanium.

8. The method of manufacturing a carbon nanotube device according to claim 1, wherein the carbon nanotube comprises a multi-wall carbon nanotube.

9. The method of manufacturing a carbon nanotube device according to claim 1, wherein the carbon nanotube comprises a single-wall carbon nanotube.

10. The method of manufacturing a carbon nanotube device according to claim 1, wherein the end of the carrying electrode carrying the conductor is pointed.

11. The method of manufacturing a carbon nanotube device according to claim 1, wherein the connecting step further comprises heating the conductor at the connection part to carbonize the conductor.

12. The method of manufacturing a carbon nanotube device according to claim 1, wherein the connecting step comprises using a scanning probe microscope.

* * * * *